US009030026B2

United States Patent
Byeon

(10) Patent No.: US 9,030,026 B2
(45) Date of Patent: May 12, 2015

(54) STACK TYPE SEMICONDUCTOR CIRCUIT WITH IMPEDANCE CALIBRATION

(71) Applicant: SK hynix Inc., Icheon-si Gyeonggi-do (KR)

(72) Inventor: Sang Jin Byeon, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/845,628

(22) Filed: Mar. 18, 2013

(65) Prior Publication Data

US 2014/0167281 A1    Jun. 19, 2014

(30) Foreign Application Priority Data

Dec. 17, 2012  (KR) .................. 10-2012-0147438
Dec. 21, 2012  (KR) .................. 10-2012-0150166

(51) Int. Cl.
*H01L 23/64*     (2006.01)
*G01R 31/28*     (2006.01)
*H01L 25/065*    (2006.01)

(52) U.S. Cl.
CPC ..... *G01R 31/2851* (2013.01); *H01L 2924/0002* (2013.01); *H01L 23/64* (2013.01); *H01L 25/0657* (2013.01); *H01L 2225/06541* (2013.01)

(58) Field of Classification Search
CPC ............... G01R 31/2851; H01L 2924/002; H01L 23/64; H01L 25/0657; H01L 2225/06541
See application file for complete search history.

(56) References Cited

U.S. PATENT DOCUMENTS

2013/0093492 A1 *  4/2013  Riho ............................ 327/333

FOREIGN PATENT DOCUMENTS

KR   1020110039205 A    4/2011
KR   1020110051860 A    5/2011

\* cited by examiner

*Primary Examiner* — Long Pham
(74) *Attorney, Agent, or Firm* — William Park & Associates Ltd.

(57) ABSTRACT

A stack type semiconductor circuit includes a plurality of semiconductor chips stacked therein, wherein the plurality of semiconductor chips are configured to share impedance calibration information. The plurality of semiconductor chips include at least one resistance value of an external resistor and an impedance calibration signal as the impedance calibration information.

6 Claims, 6 Drawing Sheets

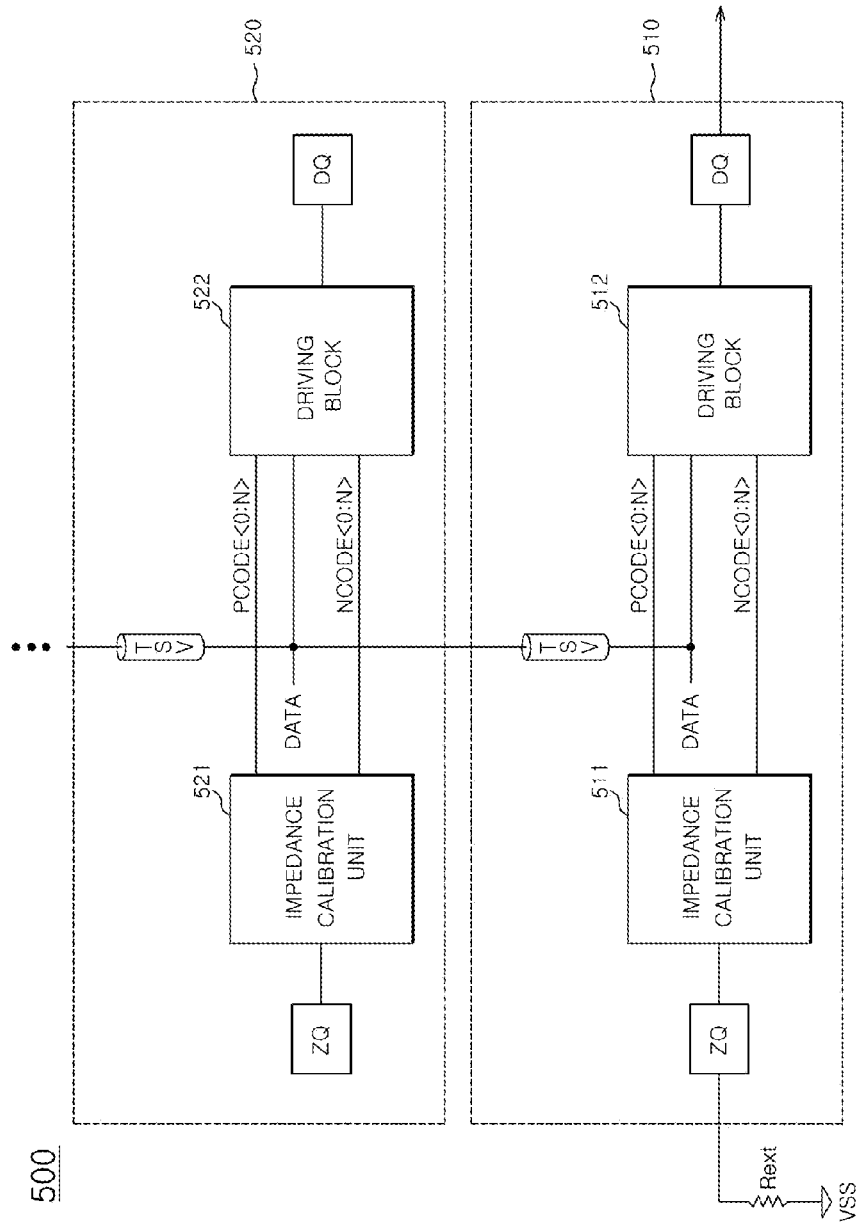

STACK TYPE SEMICONDUCTOR CIRCUIT WITH IMPEDANCE CALIBRATION

CROSS-REFERENCE TO RELATED APPLICATION

The present application claims priority under 35 U.S.C. §119(a) to Korean application number 10-2012-0147438, filed on Dec. 17, 2012, and Korean application number 10-2012-0150166, filed on Dec. 21, 2012, in the Korean Intellectual Property Office, which are incorporated herein by reference in its entirety as set forth in full.

BACKGROUND

1. Technical Field

Various embodiments generally relate to a semiconductor circuit, and more particularly, to a stack type semiconductor circuit with impedance calibration.

2. Related Art

A semiconductor circuit should perform an operation for calibrating impedance of a corresponding configuration to a target value for the configuration of an on-die termination circuit and an exact operation of a driver. Accordingly, the semiconductor circuit should have an impedance calibration unit for impedance calibration.

The semiconductor circuit may have a structure in which a plurality of semiconductor chips is stacked. When impedance calibration is not performed for each semiconductor chip, operation performance of a system including the plurality of semiconductor chips may deteriorate.

SUMMARY

A stack type semiconductor circuit enabling exact impedance calibration is described herein.

In an embodiment of the present invention, a stack type semiconductor circuit comprises a plurality of semiconductor chips configured to be stacked on each other, wherein the plurality of semiconductor chips are configured to share an impedance calibration information.

In an embodiment of the present invention, a stack type semiconductor circuit comprises a plurality of semiconductor chips configured to be stacked on each other; external resistor connection pads configured to the plurality of semiconductor chips, respectively; through vias configured to connect the plurality of semiconductor chips between the external resistor connection pads; and an external resistor configured to connect to a selected one of the external resistor connection pads of the plurality of semiconductor chips, wherein impedance calibration operations of the plurality of semiconductor chips are configured to be performed at different times.

In an embodiment of the present invention, a stack type semiconductor circuit includes a plurality of semiconductor chips configured to be stacked on each other, wherein each of the plurality of semiconductor chips includes external resistor connection pads corresponding to a number of stacked semiconductor chips, and wherein the external resistor connection pads of each of the plurality of semiconductor chips are configured to be coupled to different external resistor connection pads of semiconductor chips in a cross-coupled structure, external resistor connection pads of one of the plurality of semiconductor chips are configured to be independently coupled to different external resistors, and impedance calibration operations of the plurality of semiconductor chips are configured to be simultaneously performed.

In an embodiment of the present invention, a stack type semiconductor circuit includes a plurality of semiconductor chips configured to be stacked on each other, wherein each of the plurality of semiconductor chips is configured to include external resistor connection pads corresponding to a number of stacked semiconductor chips, wherein the external resistor connection pads of each of the plurality of semiconductor chips are configured to be coupled to different external resistor connection pads of semiconductor chips in a cross-coupled structure, external resistor connection pads of one of the plurality of semiconductor chips are configured to be independently coupled to different external resistors, and impedance calibration operations of the plurality of semiconductor chips are configured to be performed at a same time or at different times in response to a control signal.

In an embodiment of the present invention, a stack type semiconductor circuit includes a plurality of semiconductor chips configured to be stacked on each other, wherein each of the semiconductor chips includes an external resistor connection pad, wherein the external resistor connection pad of a selected semiconductor chip of the plurality of semiconductor chips is configured to be coupled to an external resistor, and a result of an impedance calibration operation based on the external resistor is configured to be shared by non-selected semiconductor chips.

In an embodiment of the present invention, a stack type semiconductor circuit includes a plurality of semiconductor chips configured to be stacked on each other, wherein each of the semiconductor chips includes an external resistor connection pad, wherein the external resistor connection pad of a selected semiconductor chip of the plurality of semiconductor chips is configured to be coupled to an external resistor, a result of an impedance calibration operation based on the external resistor is configured to be shared by non-selected semiconductor chips, and data output operations of the plurality of semiconductor chips are configured to be performed through the selected one semiconductor chip.

In an embodiment of the present invention, a stack type semiconductor circuit includes a plurality of semiconductor chips configured to be stacked on each other, wherein each of the semiconductor chips includes an external resistor connection pad, wherein the external resistor connection pad of a selected semiconductor chip of the plurality of semiconductor chips is configured to be coupled to an external resistor, data input/output pads of the plurality of semiconductor chips are configured to be coupled to each other using through vias, and the selected semiconductor chip is configured to perform an impedance calibration operation based on the external resistor, to receive data of other semiconductor chips including the selected semiconductor chip, and to output the data through a data input/output pad of the one semiconductor chip.

BRIEF DESCRIPTION OF THE DRAWINGS

Features, aspects, and embodiments are described in conjunction with the attached drawings, in which:

FIG. 6 is a circuit diagram of a stack type semiconductor circuit 500 according to still another embodiment of the present invention.

DETAILED DESCRIPTION

Figure 1:
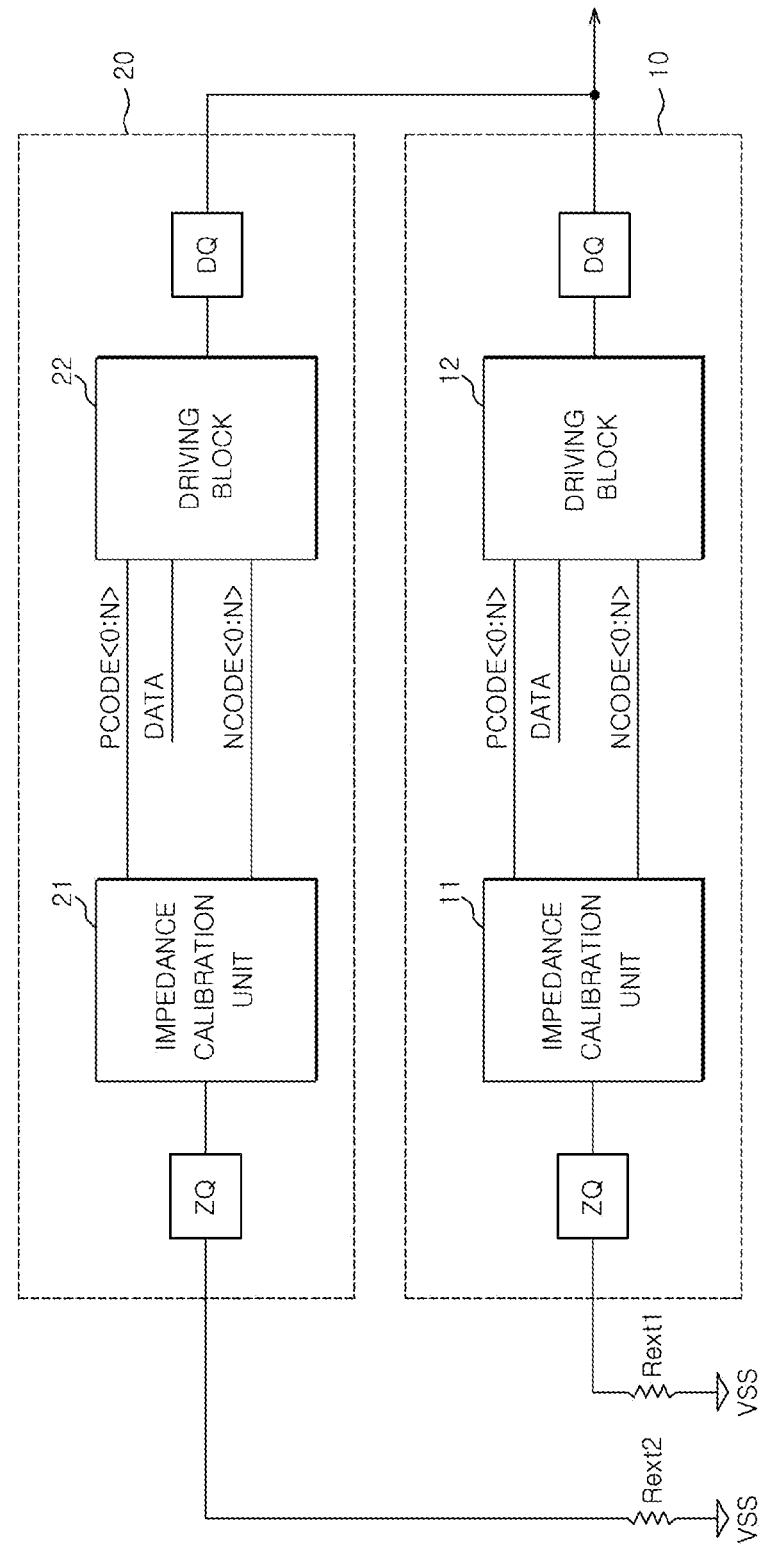
FIG. 1 is a block diagram of a stack type semiconductor circuit 1 according to an embodiment of the present invention.

Hereinafter, a stack type semiconductor circuit with impedance calibration according to the present invention will be described in detail with reference to the accompanying drawings through various embodiments. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the specification and drawings.

As illustrated in FIG. 1, the stack type semiconductor circuit 1 according to an embodiment of the present invention may include a first semiconductor chip 10 and a second semiconductor chip 20 stacked therein.

External resistors Rext1 and Rext2 may be coupled to external resistor connection pads ZQ of the first semiconductor chip 10 and the second semiconductor chip 20, respectively.

That is, the external resistor Rext1 may be coupled to the external resistor connection pad ZQ of the first semiconductor chip 10, and the other external resistor Rext2 may be coupled to the external resistor connection pad ZQ of the second semiconductor chip 20.

The first semiconductor chip 10 may include an impedance calibration unit 11, a driving block 12, and a data input/output pad DQ.

The driving block 12 may be configured to drive data DATA and output the data DATA to the data input/output pad DQ.

The impedance calibration unit 11 may be configured to calibrate impedance of the driving block 12 based on the external resistor Rext1 coupled to the external resistor connection pad ZQ.

The impedance calibration unit 11 may perform an impedance calibration operation for calibrating the impedance of the driving block 12 to be substantially equal or similar to a value of the external resistor Rext1 using impedance calibration signals PCODE<0:N> and NCODE<0:N> generated based on the external resistor Rext1.

The driving block 12 may be configured to drive data DATA in response to the impedance calibration signals PCODE<0:N> and NCODE<0:N> and to provide the driven data to a data input/output pad DQ of the first semiconductor chip 10.

The second semiconductor chip 20 may include an impedance calibration unit 21, a driving block 22, and a data input/output pad DQ.

The impedance calibration unit 21 may be configured to calibrate impedance of the driving block 22 based on the external resistor Rext2 coupled to the external resistor connection pad ZQ.

The impedance calibration unit 21 may perform an impedance calibration operation for calibrating the impedance of the driving block 22 to be substantially equal or similar to a value of the external resistor Rext2 using impedance calibration signals PCODE<0:N> and NCODE<0:N> generated based on the external resistor Rext2.

The driving block 22 may be configured to drive data DATA and output the data DATA to the data input/output pad DQ in response to the impedance calibration signals PCODE<0:N> and NCODE<0:N> and to provide the driven data to a data input/output pad DQ of the second semiconductor chip 20.

That is, the first semiconductor chip 10 and the second semiconductor chip 20 may perform independent impedance calibration operations using the external resistors Rext1 and Rext2 that are independent of each other.

Figure 2:
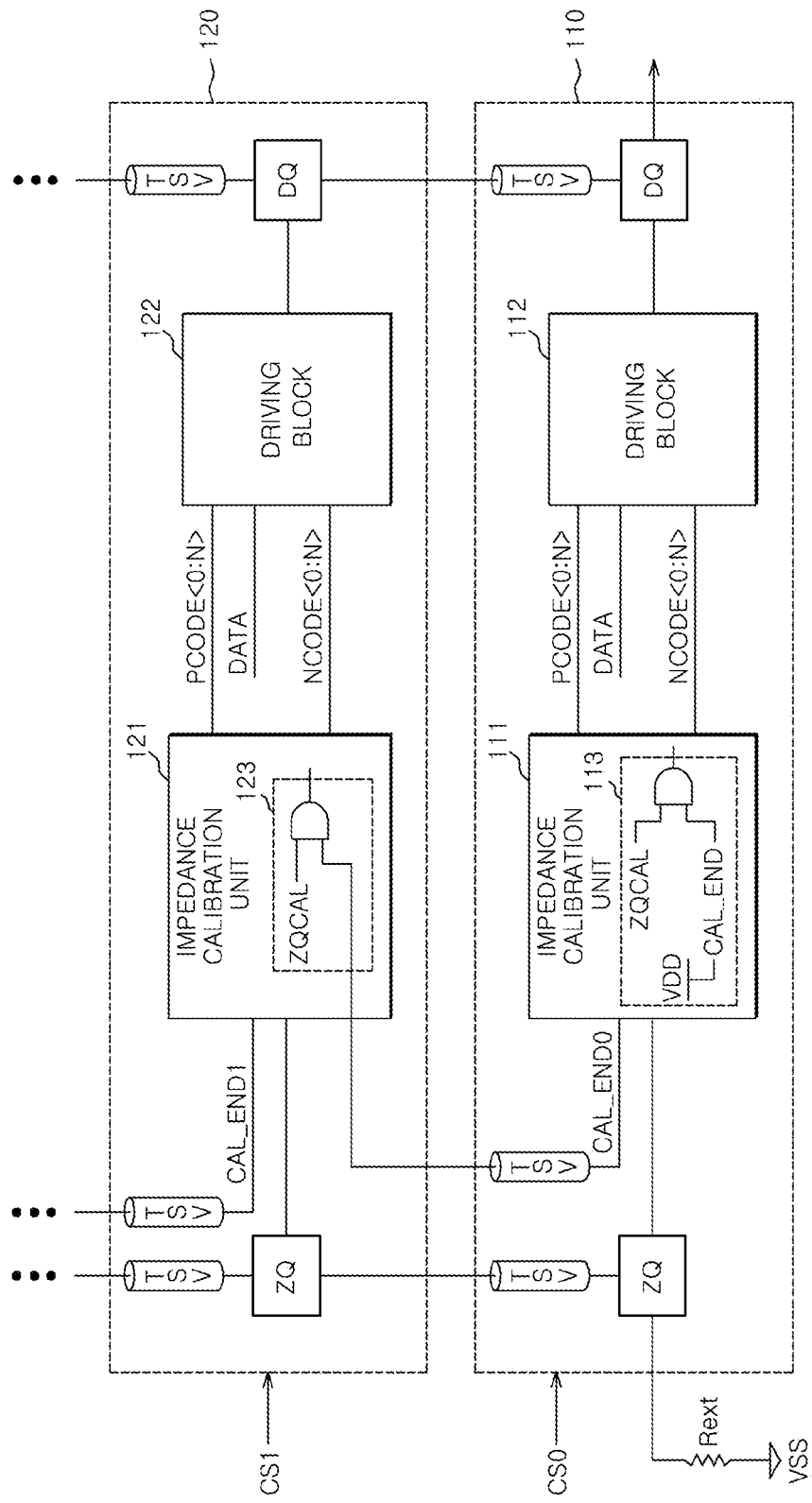
FIG. 2 is a block diagram of a stack type semiconductor circuit 100 according to another embodiment of the present invention.

Referring to FIG. 2, the stack type semiconductor circuit 100 according to an embodiment of the present invention may include a plurality of semiconductor chips 110 and 120 stacked therein, and FIG. 2 illustrates a first semiconductor chip 110 and a second semiconductor chip 120 for the purpose of convenience. Hereinafter, the first semiconductor chip 110 and the second semiconductor chip 120 will be mainly described.

In the stack type semiconductor circuit 100 according to an embodiment of the present invention, impedance calibration operations of the stacked semiconductor chips 110 and 120 may perform at different times or sequentially. The plurality of stacked semiconductor chips 110 and 120 may be independently output data through respective data input/output pads DQ.

External resistor connection pads ZQ of the first semiconductor chip 110 and the second semiconductor chip 120 may be coupled to each other through a through via.

For example, the through via may be a TSV (through-silicon to via).

The external resistor connection pad ZQ of the first semiconductor chip 110 may be coupled to an external resistor Rext.

The data input/output pads DQ of the first semiconductor chip 110 and the second semiconductor chip 120 may be coupled to each other through a through-silicon via TSV.

Furthermore, a signal line for transmitting an impedance calibration end signal CAL_END0 of the first semiconductor chip 110 may be coupled to the second semiconductor chip 120 through a through-silicon via TSV.

Since the external resistor connection pads ZQ of the first semiconductor chip 110 and the second semiconductor chip 120 may be coupled to each other using the through via, when the impedance calibration operations of the first semiconductor chip 110 and the second semiconductor chip 120 are simultaneously performed, an error may occur in the impedance calibration operations.

To prevent this error, the first semiconductor chip 110 and the second semiconductor chip 120 may be configured to perform the impedance calibration operations at different times.

The first semiconductor chip 110 may include an impedance calibration unit 111, a driving block 112, a data input/output pad DQ, the external resistor connection pad ZQ, and a plurality of through-silicon vias TSV.

The driving block 112 may be configured to drive data DATA and output the data DATA to the data input/output pad DQ.

The impedance calibration unit 111 may be configured to start an impedance calibration operation for calibrating the impedance of the driving block 112 to be substantially equal or similar to a value of the external resistor Rext using impedance calibration signals PCODE<0:N> and NCODE<0:N> generated based is on the external resistor Rext when an impedance calibration enable signal ZQCAL and an impedance calibration end signal CAL_END are activated.

The impedance calibration unit 111 may include a logic gate 113 for detecting the activation of the impedance calibration enable signal ZQCAL and the impedance calibration end signal CAL_END.

The logic gate 113 may be configured to receive a power supply voltage VDD as the impedance calibration end signal CAL_END.

The impedance calibration enable signal ZQCAL may be an external signal or an external signal of the impedance calibration unit 111. Here, the impedance calibration enable signal ZQCAL may be an internally or externally generated signal for defining an impedance calibration period.

The impedance calibration operation may be performed during an initial operation period of the semiconductor circuit.

The impedance calibration end signal CAL_END may define the end of the impedance calibration operation of a lower semiconductor chip. Since the first semiconductor chip 110 is the lowest semiconductor chip, the impedance calibration unit 111 of the first semiconductor chip 110 may receive the power supply voltage VDD as the impedance calibration end signal CAL_END.

Since the impedance calibration unit 111 may receive the power supply voltage VDD as the impedance calibration end signal CAL_END, when the impedance calibration enable signal ZQCAL is activated, the impedance calibration unit 111 may start the is impedance calibration operation.

When the impedance calibration operation is completed, the impedance calibration unit 111 may activate an impedance calibration end signal CAL_END0 that may define the end of the impedance calibration operation.

The impedance calibration end signal CAL_END0 may be transferred to the second semiconductor chip 120 through the through-silicon via TSV.

The second semiconductor chip 120 may include an impedance calibration unit 121, a driving block 122, a data input/output pad DQ, the external resistor connection pad ZQ, and a plurality of through-silicon vias TSV.

The driving block 122 may be configured to drive data DATA and output the data DATA to the data input/output pad DQ.

The impedance calibration unit 121 may be configured to start an impedance calibration operation for calibrating the impedance of the driving block 122 to be substantially equal or similar to a value of the external resistor Rext using the impedance calibration signals PCODE<0:N> and NCODE<0:N> generated based on the external resistor Rext when the impedance calibration enable signal ZQCAL and the impedance calibration end signal CAL_END0 are activated.

The impedance calibration unit 121 may include a logic gate 123 for detecting the activation of the impedance calibration enable signal ZQCAL and the impedance calibration end signal CAL_END0.

When the impedance calibration end signal CAL_END0 and the impedance calibration enable signal ZQCAL are activated, the impedance calibration unit 121 may start the impedance calibration operation.

When the impedance calibration operation is completed, the impedance calibration unit 121 may activate an impedance calibration end signal CAL_END1 that defines the end of the impedance calibration operation.

The impedance calibration end signal CAL_END1 may be transferred to an upper semiconductor chip through the through-silicon via TSV.

The impedance calibration operation of the stack type semiconductor circuit 100 configured above according to an embodiment of the present invention will be described as follows.

When the impedance calibration enable signal ZQCAL is activated, the first semiconductor chip 110 may perform the impedance calibration operation.

Then, the impedance calibration end signal CAL_END0 that defines the end of the impedance calibration operation may be activated.

Even when the impedance calibration enable signal ZQCAL is activated, since the impedance calibration end signal CAL_END0 is not activated, the impedance calibration operation of the second semiconductor chip 120 may not be performed.

While the first semiconductor chip 110 is performing the is impedance calibration operation, the second semiconductor chip 120 may substantially prevent impedance mismatch from occurring due to the second semiconductor chip 120.

Then, when the impedance calibration end signal CAL_END0 is activated, the impedance calibration operation of the second semiconductor chip 120 may be performed. When the impedance calibration operation is completed, the impedance calibration end signal CAL_END1 of the second semiconductor chip 120 may be activated.

Since the impedance calibration operation of the first semiconductor chip 110 has stopped, the impedance mismatch in the impedance calibration operation of the second semiconductor chip 120 may be substantially prevented.

Thus, all semiconductor chips may perform the impedance calibration operations at different times or sequentially, so that the impedance calibration operations of the semiconductor chips are independently performed without interfering with each other.

The first semiconductor chip 110 and the second semiconductor chip 120 may also perform the impedance calibration operations using chip select signals CS0 and CS1 at different times.

The chip select signals CS0 and CS1 may be used to select the first semiconductor chip 110 and the second semiconductor chip 120, respectively. That is, the activation or deactivation of the first semiconductor chip 110 and the second semiconductor chip 120 may be determined according to the chip select signals CS0 and CS1.

Accordingly, the chip select signal CS0 and the chip select signal CS1 may be sequentially activated with a predetermined time difference by an external device, and thus the first semiconductor chip 110 and the second semiconductor chip 120 may sequentially perform the aforementioned impedance calibration operations at different times.

Figure 3:
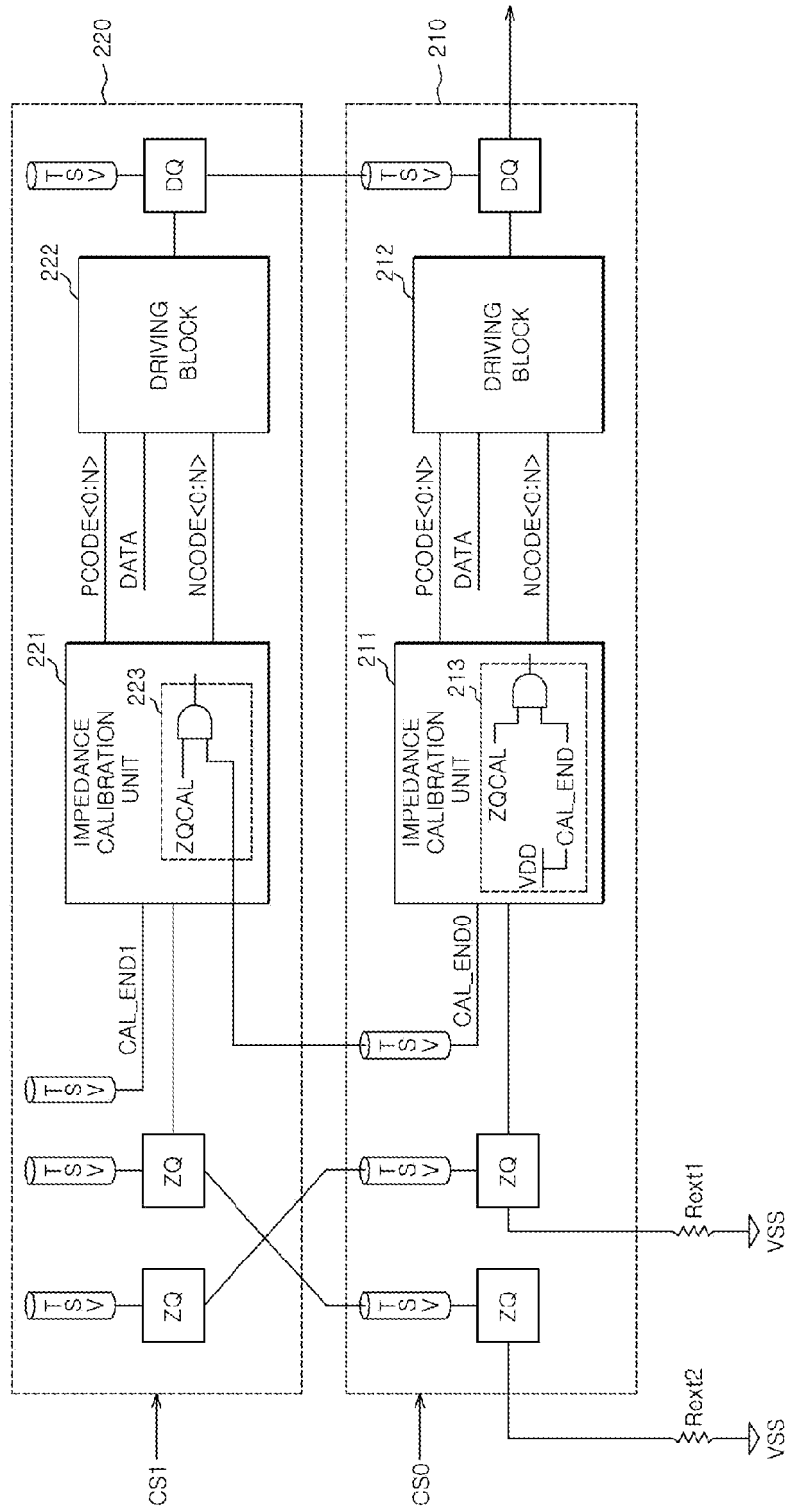
FIG. 3 is a block diagram of a stack type semiconductor circuit 200 according to further another embodiment of the present invention.

Referring to FIG. 3, the stack type semiconductor circuit 200 according to an embodiment of the present invention may include a plurality of semiconductor chips stacked therein, and for example, may include a first semiconductor chip 210 and a second semiconductor chip 220 as illustrated in FIG. 3.

In the stack type semiconductor circuit 200 according to an embodiment of the present invention, impedance calibration operations of the first semiconductor chip 210 and the second semiconductor chip 220 may be performed at different times or at the same time. Data output of the first semiconductor chip 210 and data output of the second semiconductor chip 220 may be independently performed through respective data input/output pads DQ.

The first semiconductor chip 210 and the second semiconductor chip 220 may include pads corresponding to the number of stacked semiconductor chips, such as two external resistor connection pads ZQ, respectively.

The two external resistor connection pads ZQ of the first semiconductor chip 210 and the two external resistor connection pads ZQ of the second semiconductor chip 220 may be coupled to each other in a cross-coupled structure using through vias.

The through vias may be a TSV (through-silicon via).

Connecting the aforementioned external resistor connection pads ZQ to each other in the cross-coupled structure may improve the productivity and the structural characteristics of the through-silicon via (TSV).

It may be desirable for a plurality of stack semiconductor chips to include the same type of semiconductor chip for productivity purposes. Further, all the through-silicon vias connecting a specific chip may be positioned on the same plane.

However, as illustrated in FIG. 3, two external resistor connection pads ZQ of the first semiconductor chip 210 may be different from those of the semiconductor chip 220. The external resistors Rext1 and Rext 2 may be coupled to two external resistor connection pads ZQ of the first semiconductor chip 210 and may not be directly coupled to two external resistor connection pads ZQ of the semiconductor chip 220.

Between the two external resistor connection pads ZQ of the first semiconductor chip 210, one may be coupled to an external resistor Rext1 and the other one may be coupled to an external resistor Rext2.

That is, the two external resistor connection pads ZQ may be independently coupled to respective external resistors.

Thus, although the external resistors Rext1 and Rext2 may be coupled to two external resistor connection pads ZQ of the first is semiconductor chip 210, the external resistors Rext1 and Rext2 may be independently coupled to the first semiconductor chip 210 and the second semiconductor chip 220, respectively, since the external resistor connection pads ZQ of the first semiconductor chip 210 and the second semiconductor chip 220 are coupled to each other in the cross-coupled structure.

The external resistor Rext1 may be coupled to an impedance calibration unit 211 of the first semiconductor chip 210, and the external resistor Rext2 may be coupled to an impedance calibration unit 221 of the second semiconductor chip 220.

The data input/output pads DQ of the first semiconductor chip 210 and the second semiconductor chip 220 may be coupled to each other through through-silicon vias TSV.

Furthermore, a signal line for transmitting an impedance calibration end signal CAL_END0 of the first semiconductor chip 210 may be coupled to the second semiconductor chip 220 through a through-silicon via.

The first semiconductor chip 210 may include the impedance calibration unit 211, a driving block 212, a data input/output pad DQ, a plurality of external resistor connection pads ZQ, and a plurality of through-silicon vias TSV.

The driving block 212 may be configured to drive data DATA and output the data DATA to the data input/output pad DQ.

The impedance calibration unit 211 may be configured to is start an impedance calibration operation for calibrating the impedance of the driving block 212 to be substantially equal or similar to a value of the external resistor Rext1 using impedance calibration signals PCODE<0:N> and NCODE<0:N> generated based on the external resistor Rext1 when an impedance calibration enable signal ZQCAL and an impedance calibration end signal CAL_END are activated.

The impedance calibration unit 211 may include a logic gate 213 for detecting the activation of the impedance calibration enable signal ZQCAL and the impedance calibration end signal CAL_END.

The logic gate 213 may be configured to receive a power supply voltage VDD as the impedance calibration end signal CAL_END.

The impedance calibration enable signal ZQCAL may be an external signal or an external signal of the impedance calibration unit 211.

The impedance calibration operation may be performed during an initial operation period of the semiconductor circuit, and the impedance calibration enable signal ZQCAL may be an internally or externally generated signal for defining an impedance calibration period.

The impedance calibration end signal CAL_END may define the end of the impedance calibration operation of a lower semiconductor chip. Since the first semiconductor chip 110 is the lowest semiconductor chip, the impedance calibration unit 111 of the first semiconductor chip 110 may receive the power supply voltage VDD as the impedance calibration end signal CAL_END.

Since the impedance calibration unit 211 may receive the power supply voltage VDD as the impedance calibration end signal CAL_END, when the impedance calibration enable signal ZQCAL is activated, the impedance calibration unit 211 may start the impedance calibration operation.

When the impedance calibration operation is completed, the impedance calibration unit 211 may activate an impedance calibration end signal CAL_END0 that may define the end of the impedance calibration operation.

The impedance calibration end signal CAL_END0 may be transferred to the second semiconductor chip 220 through the through-silicon via TSV.

The second semiconductor chip 220 may include an impedance calibration unit 221, a driving block 222, a data input/output pad DQ, a plurality of external resistor connection pads ZQ, and a plurality of through-silicon vias TSV.

The driving block 222 may be configured to drive data DATA and output the data DATA to the data input/output pad DQ.

The impedance calibration unit 221 may be configured to start an impedance calibration operation for calibrating the impedance of the driving block 222 to be substantially equal or similar to a value of the external resistor Rext2 using impedance calibration signals PCODE<0:N> and NCODE<0:N> generated based on the external resistor Rext2 when the impedance calibration enable signal ZQCAL and an impedance calibration end signal CAL_END0 are activated.

The impedance calibration unit 221 may include a logic gate 223 for detecting the activation of the impedance calibration enable signal ZQCAL and the impedance calibration end signal CAL_END0.

When the impedance calibration end signal CAL_END0 and the impedance calibration enable signal ZQCAL are activated, the impedance calibration unit 221 may start the impedance calibration operation.

When the impedance calibration operation is completed, the impedance calibration unit 221 may activate an impedance calibration end signal CAL_END1 that defines the end of the impedance calibration operation.

The impedance calibration end signal CAL_END1 may be transferred to an upper semiconductor chip through the through-silicon via TSV.

The aforementioned logic gates 213 and 223 may be configured such that the operations of the logic gates 213 and 223 are deactivated according to a control signal (not illustrated). When the logic gates 213 and 223 are deactivated, whether to start the impedance calibration operation may be determined according to the impedance calibration enable signal ZQCAL.

As a source for generating the control signal, a test mode signal, an MRS (mode register set), an electrical fuse (E-fuse) and the like may be used.

The impedance calibration operation of the stack type semiconductor circuit 200 configured above according to an embodiment of the present invention will be described as follows.

As described above, the external resistors Rext1 and Rext2 may be independently coupled to the first semiconductor chip 210 and the second semiconductor chip 220, so that the first semiconductor chip 210 and the second semiconductor chip 220 are able to simultaneously perform independent impedance calibration operations.

When the first semiconductor chip 210 and the second semiconductor chip 220 simultaneously perform the independent impedance calibration operations, the aforementioned logic gates 213 and 223 may be deactivated using the control signal.

Next, a description will be provided for a scheme in which the first semiconductor chip 210 and the second semiconductor chip 220 perform the impedance calibration operations at different times.

When the impedance calibration enable signal ZQCAL is activated, the first semiconductor chip 210 may perform the impedance calibration operation.

Then, the first semiconductor chip 210 may activate the impedance calibration end signal CAL_END0 that may define the end of the impedance calibration operation.

Even when the impedance calibration enable signal ZQCAL is activated, since the impedance calibration end signal CAL_END0 is not activated, the second semiconductor chip 220 may not perform the impedance calibration operation.

Then, when the impedance calibration end signal CAL_END0 is activated, the second semiconductor chip 220 may perform the impedance calibration operation, and when the impedance calibration operation ends, the second semiconductor chip 220 may activate the impedance calibration end signal CAL_END1.

Thus, the first semiconductor chip 210 and the second semiconductor chip 220 may independently perform the impedance calibration operations.

The first semiconductor chip 210 and the second semiconductor chip 220 may also perform the impedance calibration operations using chip select signals CS0 and CS1 at different times.

The chip select signals CS0 and CS1 may be used to select the first semiconductor chip 210 and the second semiconductor chip 220, respectively. That is, the activation or deactivation of the first semiconductor chip 210 and the second semiconductor chip 220 may be determined according to the chip select signals CS0 and CS1.

Accordingly, the chip select signal CS0 and the chip select signal CS1 may be sequentially activated with a predetermined time difference by an external source, and thus the first semiconductor chip 210 and the second semiconductor chip 220 may sequentially perform the aforementioned impedance calibration operations at different times.

Figure 4:
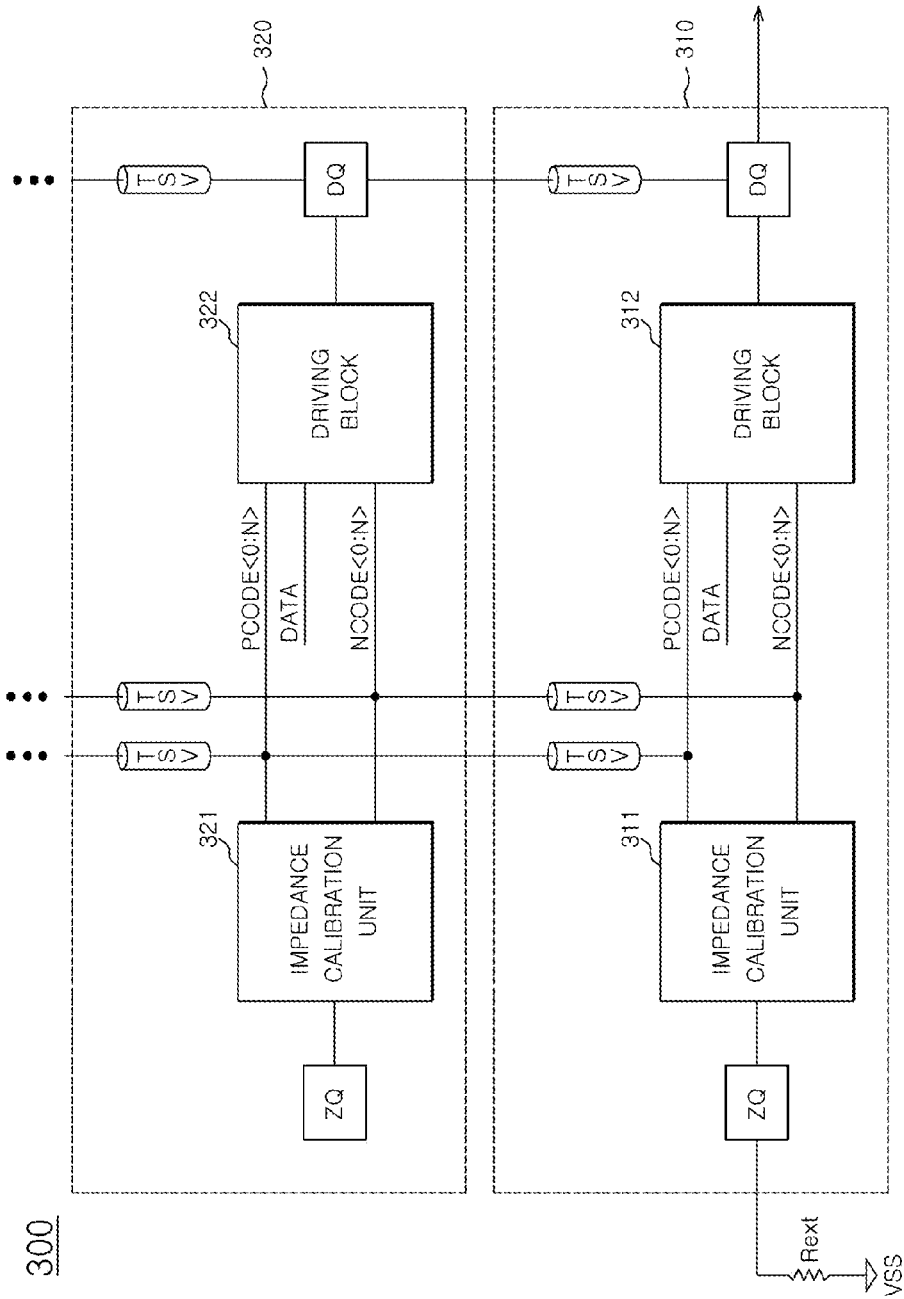
FIG. 4 is a circuit diagram of a stack type semiconductor circuit 300 according to still another embodiment of the present invention.

Referring to FIG. 4, the stack type semiconductor circuit 300 according to an embodiment of the present invention may include a plurality of semiconductor chips stacked therein, and FIG. 4 illustrates a first semiconductor chip 310 and a second semiconductor chip 320 for the purpose of convenience. Hereinafter, the first semiconductor chip 310 and the second semiconductor chip 320 will be mainly described.

In the stack type semiconductor circuit 300 according to an embodiment of the present invention, an impedance calibration operation may be performed in only one of the plurality of stacked semiconductor chips. The other semiconductor chips may share a result of the impedance calibration operation, so that impedance calibration is automatically performed. Data output of the plurality of stacked semiconductor chips may be independently performed through respective data input/output pads DQ.

An external resistor connection pad ZQ of the first semiconductor chip 310 may be coupled to an external resistor Rext.

External resistor connection pads ZQ of all semiconductor chips including the first semiconductor chip 310 and the second semiconductor chip 320 may not be coupled to one another through a through via.

For example, the through via may be a TSV (through-silicon via).

The data input/output pads DQ of the first semiconductor chip 310 and the second semiconductor chip 320 may be coupled to each other through a through-silicon via.

Furthermore, signal lines for transmitting impedance calibration signals PCODE<0:N> and NCODE<0:N> of the first semiconductor chip 310 may be coupled to the signal lines for transmitting impedance calibration signals PCODE<0:N> and NCODE<0:N> of the second semiconductor chip 320 through through-silicon vias.

The first semiconductor chip 310 may include an impedance calibration unit 311, a driving block 312, a data input/output pad DQ, the external resistor connection pad ZQ, and a plurality of through-silicon vias TSV.

The driving block 312 may have impedance that is set in response to the impedance calibration signals PCODE<0:N> and NCODE<0:N>, and may be configured to drive data DATA and output the data DATA to the data input/output pad DQ.

The impedance calibration unit 311 may be configured to perform an impedance calibration operation for calibrating the impedance of the driving block 312 to be substantially equal or similar to a value of the external resistor Rext using the impedance calibration signals PCODE<0:N> and NCODE<0:N> generated based on the external resistor Rext when an impedance calibration enable signal ZQCAL is activated.

The impedance calibration enable signal ZQCAL may be an external signal or an external signal of the impedance calibration unit 311.

The impedance calibration operation may be performed during an initial operation period of the semiconductor circuit, and the impedance calibration enable signal ZQCAL may be an internally or externally generated signal for defining an impedance calibration period.

The second semiconductor chip 320 may include an impedance calibration unit 321, a driving block 322, a data input/output pad DQ, a plurality of through-silicon vias TSV, and the external resistor connection pad ZQ. Since the external resistor connection pad ZQ of the second semiconductor chip 320 may not be coupled with any external resistor, the impedance calibration unit 321 and the external resistor connection pad ZQ of the second semiconductor chip 320 may not perform an impedance calibration as the first semiconductor chip 310. Therefore, the impedance calibration unit 321 and the external resistor connection pad ZQ of the second semiconductor chip 320 can be omitted in the second semiconductor chip 320.

That is, according to an embodiment of the present invention, the impedance calibration signals PCODE<0:N> and NCODE<0:N>, which are generated by performing the impedance calibration operation in the first semiconductor chip 310, may be shared by the other semiconductor chips including the second semiconductor chip 320, so that impedance calibration may be automatically performed.

Consequently, the other semiconductor chips, except for the first semiconductor chip 310, may exclude the impedance calibration unit 321 and the external resistor connection pad ZQ from the circuit configuration.

However, in terms of the productivity, it may be difficult to configure a specific chip differently. In this regard, the second semiconductor chip 320 may be configured to include the impedance calibration unit 321, the external resistor connection pad ZQ, the driving block 322, the data input/output pad DQ, and the plurality of through-silicon vias TSV, as in the first semiconductor chip 310.

The driving block 322 may have impedance that is set in response to the impedance calibration signals PCODE<0:N> and NCODE<0:N>, and may be configured to drive data DATA and output the data DATA to the data input/output pad DQ.

The impedance calibration according to an embodiment of the present invention will be described as follows.

When the impedance calibration enable signal ZQCAL is activated, the impedance calibration operation of the first semiconductor chip 310 may be performed.

The impedance calibration signals PCODE<0:N> and NCODE<0:N> generated in the first semiconductor chip 310 may be transferred to the second semiconductor chip 320 through the plurality of through-silicon vias TSV.

Thus, simultaneously with the impedance calibration operation of the first semiconductor chip 310, the impedance calibration operations of all the semiconductor chips including the second semiconductor chip 320 may be automatically performed.

Data output of the first semiconductor chip 310 and data output of the second semiconductor chip 320 may be independently performed through respective data input/output pads DQ.

However, data outputted through the data input/output pad DQ of the second semiconductor chip 320 may be transferred to the data input/output pad DQ of the first semiconductor chip 310 through the through-silicon via TSV.

Figure 5:
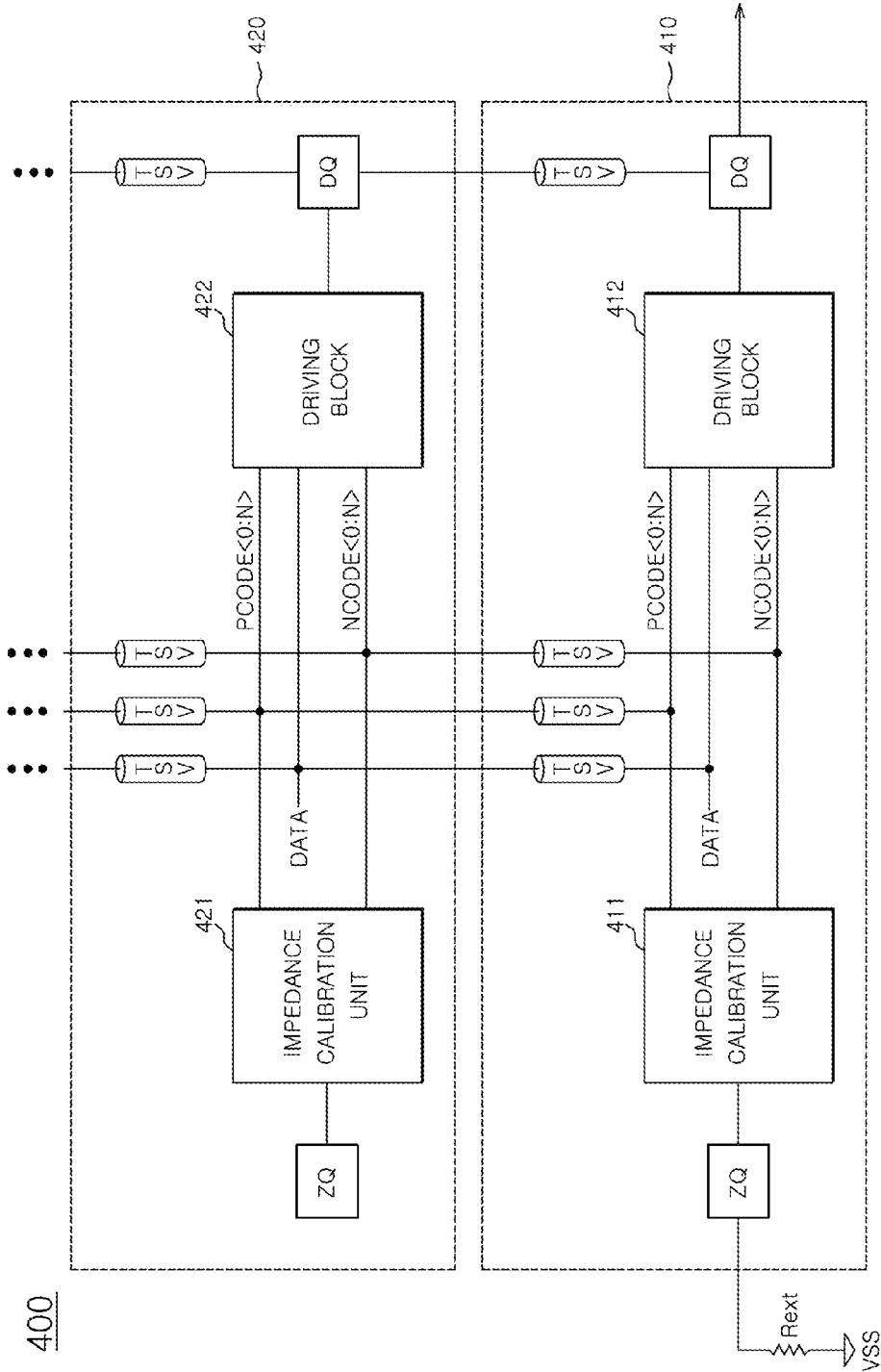
FIG. 5 is a circuit diagram of a stack type semiconductor circuit 400 according to still another embodiment of the present invention.

Referring to FIG. 5, the stack type semiconductor circuit 400 according to an embodiment of the present invention may include a plurality of semiconductor chips stacked therein, and FIG. 5 may illustrate a first semiconductor chip 410 and a second semiconductor chip 420 for the purpose of convenience. Hereinafter, the first semiconductor chip 410 and the second semiconductor chip 420 will be mainly described.

In the stack type semiconductor circuit 400 according to an embodiment of the present invention, an impedance calibration operation may be performed in only one of the plurality of stacked semiconductor chips, as in an embodiment related to FIG. 4. The other semiconductor chips may share a result of the impedance calibration operation, so that impedance calibration may be automatically performed. Furthermore, data output of the plurality of stacked semiconductor chips may also be performed through a data input/output pad DQ of one semiconductor chip that performs the impedance calibration operation.

However, data input/output pads DQ of all semiconductor is chips may be coupled to one another through through vias, so that a result of an on-die termination operation can be provided to semiconductor chips not performing the impedance calibration operation.

An external resistor connection pad ZQ of the first semiconductor chip 410 may be coupled to an external resistor Rext.

External resistor connection pads ZQ of all the semiconductor chips including the first semiconductor chip 410 and the second semiconductor chip 420 may not be coupled to one another.

The data input/output pads DQ of the first semiconductor chip 410 and the second semiconductor chip 420 may be coupled to each other through a through via.

A TSV (through-silicon via) may be used for the through via.

Signal lines for transmitting impedance calibration signals PCODE<0:N> and NCODE<0:N> of the first semiconductor chip 410 may be coupled to the signal lines for transmitting impedance calibration signals PCODE<0:N> and NCODE<0:N> of the second semiconductor chip 420 through a plurality of through-silicon vias.

Furthermore, signal lines for transmitting data of the first semiconductor chip 410 may be coupled to the signal lines for transmitting data of the second semiconductor chip 420 through a plurality of through-silicon vias.

The first semiconductor chip 410 may include an impedance calibration unit 411, a driving block 412, the data input/output pad DQ, the external resistor connection pad ZQ, and a plurality of through-silicon vias TSV.

The driving block 412 may have impedance that is set in response to the impedance calibration signals PCODE<0:N> and NCODE<0:N>, and may be configured to drive data DATA and output the data DATA to the data input/output pad DQ.

The impedance calibration unit 411 may be configured to perform an impedance calibration operation for calibrating the impedance of the driving block 412 to be substantially equal or similar to a value of the external resistor Rext using the impedance calibration signals PCODE<0:N> and NCODE<0:N> generated based on the external resistor Rext when an impedance calibration enable signal ZQCAL is activated.

The impedance calibration enable signal ZQCAL may be an external signal or an external signal of the impedance calibration unit 411.

The impedance calibration operation may be performed during an initial operation period of the semiconductor circuit, and the impedance calibration enable signal ZQCAL may be an internally or externally generated signal for defining an impedance calibration period.

The second semiconductor chip 420 may include an impedance calibration unit 421, driving block 422, the data input/output pad DQ, a plurality of through-silicon vias TSV, and the external resistor connection pad ZQ. Since the external resistor connection pad ZQ of the second semiconductor chip 420 may not be coupled with any external resistor, the impedance calibration unit 421 and the external resistor connection pad ZQ of the second semiconductor chip 420 may not perform an impedance calibration as the first semiconductor chip 410. Therefore, the impedance calibration unit 421 and the external resistor connection pad ZQ of the second semiconductor chip 420 can be omitted in the second semiconductor chip 420.

According to an embodiment of the present invention, the impedance calibration signals PCODE<0:N> and NCODE<0:N>, which are generated by performing the impedance calibration operation in the first semiconductor chip 410, may be shared by the other semiconductor chips including the second semiconductor chip 420, so that impedance calibration is automatically performed.

Consequently, the other semiconductor chips, except for the first semiconductor chip 410, are able to exclude the impedance calibration unit 421 and the external resistor connection pad ZQ from the circuit configuration.

However, in terms of the productivity, it may be difficult to configure a specific chip differently. In this regard, the second semiconductor chip 420 may be configured to include the impedance calibration unit 421, the external resistor connection pad ZQ, the driving block 422, the data input/output pad DQ, and the plurality of through-silicon vias TSV.

The driving block 422 may have impedance that is set in response to the impedance calibration signals PCODE<0:N> and NCODE<0:N>.

The impedance calibration of the stack type semiconductor circuit 400 configured above according to an embodiment of the present invention will be described as follows.

When the impedance calibration enable signal ZQCAL is activated, the first semiconductor chip 410 may perform the impedance calibration operation.

The impedance calibration signals PCODE<0:N> and NCODE<0:N> generated in the first semiconductor chip 410 may be transferred to the second semiconductor chip 420 through the plurality of through-silicon vias TSV.

Thus, simultaneously with the impedance calibration operation of the first semiconductor chip 410, the impedance calibration operations of all semiconductor chips including the second semiconductor chip 420 may be automatically performed.

Furthermore, data DATA of all the semiconductor chips including the second semiconductor chip 420 may be transferred to the first semiconductor chip 410 through the through-silicon vias TSV.

That is, data output operations of all the semiconductor chips may be performed through the data input/output pad DQ of the first semiconductor chip 410.

However, data input/output pads DQ of all the semiconductor chips may be coupled to one another through the is through-silicon vias, so that semiconductor chips not performing the impedance calibration operation may perform an on-die termination operation.

Referring to FIG. 6, the stack type semiconductor circuit 500 according to an embodiment of the present invention may include a plurality of semiconductor chips stacked therein, and FIG. 6 may illustrate a first semiconductor chip 510 and a second semiconductor chip 520 for the purpose of convenience. Hereinafter, the first semiconductor chip 510 and the second semiconductor chip 520 will be mainly described.

In the stack type semiconductor circuit 500 according to an embodiment of the present invention, only one of the plurality of stacked semiconductor chips may perform an impedance calibration operation, and data output of the plurality of stacked semiconductor chips may also be performed through a data input/output pad DQ of one semiconductor chip that may perform the impedance calibration operation.

An external resistor connection pad ZQ of the first semiconductor chip 510 may be coupled to an external resistor Rext.

External resistor connection pads ZQ of all semiconductor chips including the first semiconductor chip 510 and the second semiconductor chip 520 mat not be coupled to one another.

The data input/output pads DQ of all the semiconductor chips including the first semiconductor chip 510 and the second semiconductor chip 520 may also not be coupled to one another.

A signal line for transmitting data of the first semiconductor chip 510 may be coupled to a signal line for transmitting data of the second semiconductor chip 520 through through vias.

A TSV (through-silicon via) may be used for the through via.

The first semiconductor chip 510 may include an impedance calibration unit 511, a driving block 512, the data input/output pad DQ, the external resistor connection pad ZQ, and the through-silicon via TSV.

The driving block 512 may have impedance that is set in response to the impedance calibration signals PCODE<0:N> and NCODE<0:N>, and may be configured to drive data DATA and output the data DATA to the data input/output pad DQ.

The impedance calibration unit 511 may be configured to perform an impedance calibration operation for calibrating the impedance of the driving block 512 to be substantially equal or similar to a value of the external resistor Rext using the impedance calibration signals PCODE<0:N> and NCODE<0:N> generated based on the external resistor Rext when an impedance calibration enable signal ZQCAL is activated.

The impedance calibration enable signal ZQCAL may be an external signal or an external signal of the impedance calibration unit 511.

The impedance calibration operation may be performed during an initial operation period of the semiconductor circuit, and the impedance calibration enable signal ZQCAL may be an internally or is externally generated signal for defining an impedance calibration period.

The second semiconductor chip 520 may only include a through-silicon via TSV for transmitting data DATA. Although the second semiconductor chip 520 shown in the FIG. 3 includes an impedance calibration unit 521, an external resistor connection pad ZQ, a driving block 522, and a data input/output pad DQ, the impedance calibration unit 521, the external resistor connection pad ZQ, the driving block 522, and the data input/output pad DQ can be omitted in this embodiment.

According to an embodiment of the present invention, only the first semiconductor chip 510 may perform the impedance calibration among the plurality of stacked semiconductor chips, and data output may also be performed through only the data input/output pad DQ of the first semiconductor chip 510.

Accordingly, in the second semiconductor chip 420 (other semiconductor chips), the impedance calibration unit 521, the external resistor connection pad ZQ, the driving block 522, and the data input/output pad DQ may be excluded from the circuit configuration.

However, in terms of the productivity, it may be difficult to configure a specific chip differently. In this regard, the second semiconductor chip 520 may be configured to include the impedance calibration unit 521, the external resistor connection pad ZQ, the driving block 522, the data input/output pad DQ, and the through-silicon via TSV.

The impedance calibration of the stack type semiconductor circuit 500 configured above according to an embodiment of the present invention will be described as follows.

When the impedance calibration enable signal ZQCAL is activated, the first semiconductor chip 510 may perform the impedance calibration operation.

Data DATA of all the semiconductor chips including the second semiconductor chip 520 may be transferred to the first semiconductor chip 510 through the through-silicon via TSV.

That is, data output operations of all the semiconductor chips may be performed through the data input/output pad DQ of the first semiconductor chip 510.

While certain embodiments have been described above, it will be understood to those skilled in the art that the embodiments described are by way of example only. Accordingly, the stack type semiconductor circuit with impedance calibration described herein should not be limited based on the described embodiments. Rather, the stack type semiconductor circuit with impedance calibration described herein should only be limited in light of the claims that follow when taken in conjunction with the above description and accompanying drawings.

What is claimed is:

1. A stack type semiconductor circuit, comprising:
   a plurality of semiconductor chips configured to be stacked on one another;
   external resistor connection pads configured to the plurality of semiconductor chips, respectively;
   through vias configured to connect between the external resistor connection pads; and
   an external resistor configured to connect to a selected one of the external resistor connection pads of the plurality of semiconductor chips,
   wherein impedance calibration operations of the plurality of semiconductor chips are configured to be performed at different times.

2. The stack type semiconductor circuit according to claim 1, wherein each of the plurality of semiconductor chips is configured to transmit an impedance calibration end signal to an upper semiconductor chip,
   wherein the impedance calibration end signal is a signal for defining an end to the impedance calibration operation.

3. The stack type semiconductor circuit according to claim 2, further comprising:
   a through via through which the impedance calibration end signal is transmitted to the upper semiconductor chip.

4. The stack type semiconductor circuit according to claim 2, wherein the upper semiconductor chip is configured to perform an impedance calibration operation in response to the impedance calibration end signal.

5. The stack type semiconductor circuit according to claim 2, wherein each of the plurality of semiconductor chips comprises:
   a driving block configured to drive inputted data; and
   an impedance calibration unit configured to start an operation for calibrating impedance of the driving block based on a resistance value of the external resistor when an impedance calibration enable signal and the impedance calibration end signal are activated.

6. The stack type semiconductor circuit according to claim 1, wherein the plurality of semiconductor chips are configured to perform the impedance calibration operations at different times in response to chip select signals that are activated at different times.

* * * * *